United States Patent
Bian et al.

(10) Patent No.: US 8,501,577 B2
(45) Date of Patent: Aug. 6, 2013

(54) PREPARATION METHOD FOR FULL-ISOLATED SOI WITH HYBRID CRYSTAL ORIENTATIONS

(75) Inventors: Jiantao Bian, Shanghai (CN); Zengfeng Di, Shanghai (CN); Miao Zhang, Shanghai (CN)

(73) Assignee: Shanghai Institute of Microsystem and Information Technology, Chinese Academy of Sciences, Changning District, Shanghai (CN)

( * ) Notice: Subject to any disclaimer, the term of this patent is extended or adjusted under 35 U.S.C. 154(b) by 0 days.

(21) Appl. No.: 13/636,126

(22) PCT Filed: May 16, 2012

(86) PCT No.: PCT/CN2012/075554
§ 371 (c)(1),
(2), (4) Date: Sep. 20, 2012

(87) PCT Pub. No.: WO2012/155833
PCT Pub. Date: Nov. 22, 2012

(65) Prior Publication Data
US 2013/0071993 A1 Mar. 21, 2013

(30) Foreign Application Priority Data
May 16, 2011 (CN) .......................... 2011 1 0125558

(51) Int. Cl.
*H01L 21/76* (2006.01)
(52) U.S. Cl.
USPC ........... 438/413; 438/149; 438/150; 438/411; 438/412; 257/E21.54
(58) Field of Classification Search
USPC ............... 438/411, 412, 413; 257/E21.54
See application file for complete search history.

(56) References Cited

U.S. PATENT DOCUMENTS

| | | | | |
|---|---|---|---|---|
| 4,888,300 A | * | 12/1989 | Burton | 438/404 |
| 6,277,703 B1 | * | 8/2001 | Barlocchi et al. | 438/412 |
| 7,351,616 B2 | * | 4/2008 | Kato | 438/149 |
| 7,432,149 B2 | * | 10/2008 | Wu et al. | 438/222 |
| 7,825,011 B2 | * | 11/2010 | Meunier-Beillard et al. | 438/478 |
| 2005/0142700 A1 | * | 6/2005 | Cheng et al. | 438/149 |
| 2008/0146017 A1 | * | 6/2008 | Kato | 438/618 |

* cited by examiner

*Primary Examiner* — Angel Roman
(74) *Attorney, Agent, or Firm* — Global IP Services; Tianhua Gu

(57) ABSTRACT

A preparation method for a full-isolated silicon on insulator (SOI) substrate with hybrid crystal orientations and a preparation method of a complementary metal oxide semiconductor (CMOS) integrated circuit (IC) based on the method are disclosed. In the preparation method for the full-isolated SOI substrate with hybrid crystal orientations provided in the present invention, a SiGe layer is adopted to serve as an epitaxial virtual substrate layer with a first crystal orientation, so as to form a strained top silicon with the first crystal orientation; a polysilicon supporting material is adopted to serve as a support for connecting the top silicon with the first crystal orientation and a top silicon with a second crystal orientation, so that the SiGe layer below the strained top silicon with the first crystal orientation may be removed, and an insulating material is filled to form an insulating buried layer. The top silicon and the insulating buried layer formed in the method have uniform and controllable thickness, the strained silicon formed in the window and the top silicon outside the window have different crystal orientations, so as to provide higher mobility for the NMOS and the PMOS respectively, thereby improving the performance of the CMOS IC.

10 Claims, 9 Drawing Sheets

PREPARATION METHOD FOR FULL-ISOLATED SOI WITH HYBRID CRYSTAL ORIENTATIONS

CROSS REFERENCE TO RELATED PATENT APPLICATION

The present application is the US national stage of PCT/CN2012/075554 filed on May 16, 2012, which claims the priority of the Chinese patent application No. 201110125558.9 filed on May 16, 2011, which application is incorporated herein by reference.

BACKGROUND OF THE PRESENT INVENTION

1. Field of Invention

The present invention relates to a preparation method of a semiconductor device substrate, specifically, to a preparation method of a full-isolated silicon on insulator (SOI) substrate with hybrid crystal orientations, which belongs to the field of semiconductor device fabrication.

2. Description of Related Arts

A complementary metal oxide semiconductor (CMOS) device is a semiconductor device integrating an N-channel metal oxide semiconductor (NMOS) diode and a P-channel metal oxide semiconductor (PMOS) diode on the same substrate. With the development of the CMOS technology, how to control the stability of the device and improve the performance of the device has become an serious challenge encountered by gradually reduced device size. SOI (silicon on Insulator) refers to the silicon on insulator technology, the SOI technology reduces source-drain parasitic capacitance, so the speed of an SOI circuit is significantly improved as compared with the speed of a conventional bulk-silicon circuit, and at the same time, the SOI has a series of advantages such as small short-channel effect, desired latch-up prevention, and simple process, so the SOI technology has gradually become a main technology for fabricating a very large scale silicon integrated circuit (IC) with high-speed, low-power consumption, high-integration, and high-reliability. The SOI is generally constructed by the following three layers: a thin monocrystalline silicon top layer, on which an IC is formed; a very-thin buried oxide (BOX), that is, an silicon dioxide insulating intermediate layer; and a very-thick bulk substrate silicon substrate layer, which mainly provide mechanical support for the above two layers. An oxide layer in the SOI structure isolates the silicon film layer above from the bulk silicon substrate layer, so a large area of a p-n junction is replaced with a dielectric isolation. A source region and a drain region extend downwards to the BOX, which effectively reduces the leakage current and junction capacitance.

In addition, for a Si material, hole mobility in a (110) Si substrate is increased by more than twice as compared with that in a convention (100) Si substrate; and electron mobility is the highest in the (100) Si substrate. In a current CMOS IC, the NMOS and the PMOS are both fabricated on the (100) silicon substrate. Since the (100) Si substrate has the highest electron mobility, which is higher than the hole mobility by about 2-4 times, it is required to design a PMOS with larger gate width to balance the NMOS, and therefore, it is hard to obtain a CMOS device and circuit with higher performance In order to fully utilize the advantage that the carrier mobility depends on Si surface orientation, Yang et al. in the IBM Company developed a new technology of fabricating a CMOS circuit by adopting a Si substrate with hybrid crystal orientations. Yang M, leong M, Shi L et al. have introduced their technology in the paper entitled "High performance CMOS fabricated on hybrid substrate with different crystal orientations" in "Digest of Technical Paper of International Electron Devices Meeting" in 2003. Through bonding and selective epitaxial growth, an NMOS device is fabricated on a (100) Si surface with a BOX, and a PMOS device is fabricated on a (110) Si surface, so that the performance of the PMOS device can be greatly improved. When $I_{off}$=100 nA/μm, the drive current of the PMOS device on the (110) substrate is increased by 45%. The disadvantage thereof is that the PMOS device fabricated on the epitaxial layer has no BOX to isolate the PMOS device with the substrate, and therefore the device performance is still affected. The patent document of US patent No. US2007/0281446A1 discloses a fabrication method of an SOI substrate with hybrid crystal orientations, in which a bottom silicon is exposed by etching a trench, and a (110) silicon material with a crystal orientation different from that of an original (100) top silicon is epitaxially grown from the bottom silicon by the lateral selective epitaxial growth process, thereby obtaining an SOI substrate with hybrid crystal orientations. The method has a complicated fabrication process, and the (110) silicon material thereof is obtained by direct epitaxial growth of the bottom silicon. However, along with the further reduction of characteristics dimension of the device, the low hole mobility of the common silicon material will become one of the bottlenecks for improving of the device performance.

In order to further improve the performance of the CMOS IC, the present invention provides a new technology for a full-isolated SOI substrate with hybrid crystal orientations, which provides a strained silicon material while implementing the SOI substrate with hybrid crystal orientations, and can provide a substrate having higher mobility respectively for the NMOS and the PMOS.

SUMMARY OF THE PRESENT INVENTION

An object of the present invention is to provide a preparation method for a full-isolated SOI substrate with hybrid crystal orientations, and a preparation method for a CMOS IC based on the method.

In order to solve the above technical problems, the present invention adopts the following technical solutions.

A preparation method for a full-isolated SOI substrate with hybrid crystal orientations comprises the following steps:

step 1: providing an SOI substrate, wherein the SOI substrate comprises a bottom silicon with a first crystal orientation, an insulating buried layer located on the bottom silicon, and a top silicon with a second crystal orientation and located on the insulating buried layer;

step 2: etching the SOI substrate to form a window, wherein the window exposes a part of the bottom silicon, and forming a spacer isolation structure on side walls at periphery of the window;

step 3: epitaxially growing a SiGe layer with the first crystal orientation in the window formed with the spacer isolation structure, and continuing to epitaxially grow a top silicon with the first crystal orientation on the SiGe layer;

step 4: etching a part of the spacer isolation structure at opposite two sides of the window to expose a part of the bottom silicon, and depositing a supporting material at the position where the part of the spacer isolation structure is etched away, so as to serve as a support for connecting the top silicon with the first crystal orientation and the top silicon with the second crystal orientation;

step 5: etching the rest spacer isolation structure, and removing the SiGe layer by adopting a selective etching process, so that the top silicon with the first crystal orientation is suspended;

step 6: filling an insulating material below the top silicon with the first crystal orientation to form a second insulating buried layer; and step 7: removing the insulating material and the supporting material at the periphery of the top silicon with the first crystal orientation, fabricating a shallow trench isolation (STI) structure at the periphery of the top silicon with the first crystal orientation, and finally obtaining the full-isolated SOI substrate with hybrid crystal orientations.

In a preferred solution of the present invention, in step 2, a first hard mask is formed on the SOI substrate, and then etching is performed to form the window. In step 7, the first hard mask is first removed, a second hard mask is fabricated to cover the surface of the SOI substrate, the insulating material and the supporting material at the periphery of the top silicon with the first crystal orientation are removed through etching, the STI structure is fabricated at the periphery of the top silicon with the first crystal orientation, the second hard mask is removed through hot phosphoric-acid etching, and finally, the full-isolated SOI substrate with hybrid crystal orientations is obtained.

In a preferred solution of the present invention, the first crystal orientation refers to a (110) crystal orientation, and the second crystal orientation refers to a (100) crystal orientation; or the first crystal orientation refers to the (100) crystal orientation, and the second crystal orientation refers to the (110) crystal orientation.

In a preferred solution of the present invention, the supporting material is polysilicon.

In a preferred solution of the present invention, in step 6, the insulating material is filled below the top silicon with the first crystal orientation through chemical vapor deposition (CVD) to form the second insulating buried layer.

In a preferred solution of the present invention, the top silicon with the first crystal orientation may be a strained silicon or non-strained silicon with the first crystal orientation, which depends on the thickness of the epitaxial growth.

A preparation method of a CMOS IC based on a full-isolated SOI substrate with hybrid crystal orientations comprises the following steps:

step 1: providing an SOI substrate, wherein the SOI substrate comprises a bottom silicon with a first crystal orientation, an insulating buried layer located on the bottom silicon, and a top silicon with a second crystal orientation and located on the insulating buried layer;

step 2: etching the SOI substrate to form a window, wherein the window exposes a part of the bottom silicon, forming a spacer isolation structure on side walls at periphery of the window;

step 3: epitaxially growing a SiGe layer with the first crystal orientation in the window formed with the spacer isolation structure, and continuing to epitaxially grow a top silicon with the first crystal orientation on the SiGe layer;

step 4: etching a part of the spacer isolation structure at opposite two sides of the window to expose a part of the bottom silicon, and depositing a supporting material at the position where the part of the spacer isolation structure is etched away, so as to serve as a support for connecting the top silicon with the first crystal orientation and the top silicon with the second crystal orientation;

step 5: etching the rest spacer isolation structure, and removing the SiGe layer by adopting a selective etching process, so that the top silicon with the first crystal orientation is suspended;

step 6: filling an insulating material below the top silicon with the first crystal orientation to form a second insulating buried layer;

step 7: removing the insulating material and the supporting material at the periphery of the top silicon with the first crystal orientation, fabricating an STI structure at the periphery of the top silicon with the first crystal orientation, and finally obtaining the full-isolated SOI substrate with hybrid crystal orientations; and step 8: fabricating a first type MOS device on the top silicon with the first crystal orientation of the obtained full-isolated SOI substrate with hybrid crystal orientations; and fabricating a second type MOS device on the top silicon with the second crystal orientation of the obtained full-isolated SOI substrate with hybrid crystal orientations.

In a preferred solution of the present invention, the first crystal orientation is the (110) crystal orientation, so the first type MOS device is a PMOS device; the second crystal orientation is the (100) crystal orientation, so the second type MOS device is an NMOS device.

In a preferred solution of the present invention, the first crystal orientation is the (100) crystal orientation, so the first type MOS device is an NMOS device; the second crystal orientation is the (110) crystal orientation, so the second type MOS device is a PMOS device.

The present invention has the following benefits:

In the preparation method of the full-isolated SOI substrate with hybrid crystal orientations provided in the present invention, the SiGe layer is adopted to serve as an epitaxial virtual substrate layer with the first crystal orientation, so as to form the strained silicon with the first crystal orientation; the polysilicon supporting material is adopted to serve as the support for connecting the top silicon with the first crystal orientation and the top silicon with the second crystal orientation, so that the SiGe layer below the strained silicon with the first crystal orientation may be removed, and the insulating material is filled to form the insulating buried layer. The top silicon and the insulating buried layer formed in the method have uniform and controllable thickness, the strained silicon formed in the window and the top silicon outside the window have different crystal orientations, so as to provide higher mobility for the NMOS and the PMOS respectively, thereby improving the performance of the CMOS IC.

BRIEF DESCRIPTION OF THE DRAWINGS

FIGS. 1-12 are schematic flow chart of a preparation method for a full-isolated SOI substrate with hybrid crystal orientations according to Embodiment 1 of the present invention;

where, FIG. 5b is a cross-sectional view along A-A' direction in FIG. 5a.

DETAILED DESCRIPTION OF THE PREFERRED EMBODIMENTS

Specific implementation steps of the present invention are further illustrated in detail according to the accompanying drawings. Figures are not drawn to scale for ease of representation.

Embodiment 1

Figure 1:
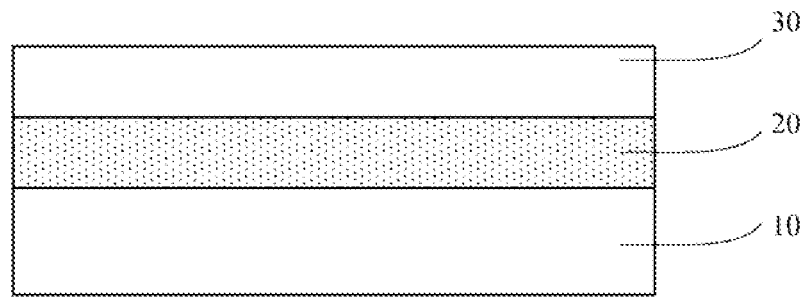

Referring to FIGS. 1-12, a preparation method for a full-isolated SOI substrate with hybrid crystal orientations provided in the present invention has the following specific implementation steps:

Step 1: As shown in FIG. 1, an SOI substrate is provided, where the SOI substrate includes a bottom silicon 10 with a first crystal orientation, an insulating buried layer 20 located on the bottom silicon 10, and a top silicon 30 with a second crystal orientation and located on the insulating buried layer 20; the SOI substrate is an SOI substrate with hybrid crystal orientations, where the first crystal orientation and the second crystal orientation may respectively be a (110) crystal orientation and a (100) crystal orientation, or the (100) crystal orientation and the (110) crystal orientation, and in this embodiment, the first crystal orientation is preferably the (110) crystal orientation; and the second crystal orientation is preferably the (100) crystal orientation.

Figure 2:
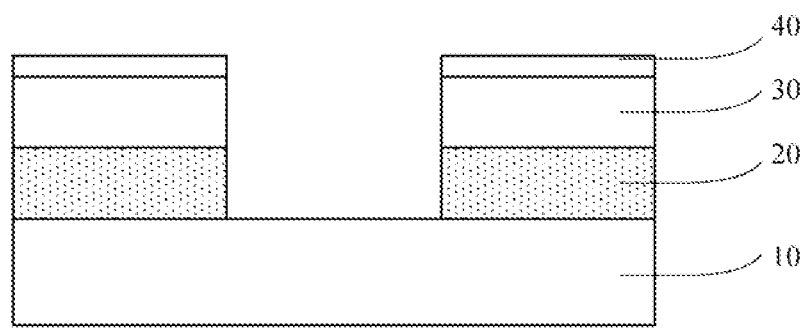
Figure 3:
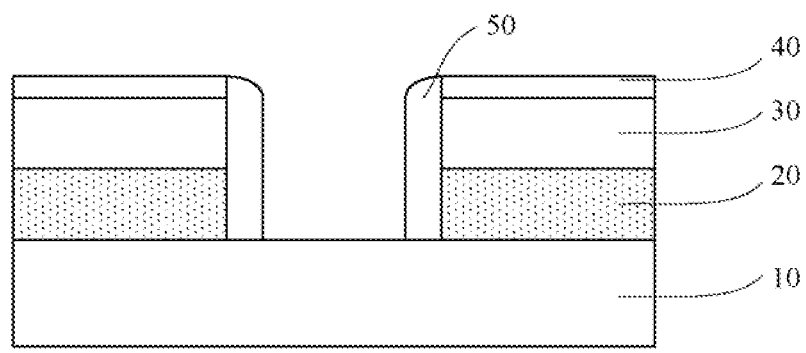

Step 2: As shown in FIGS. 2-3, a first hard mask 40 is formed on the SOI substrate, where the hard mask 40 preferably selects silicon nitride, a window is formed through etching so that the window exposes a part of the bottom silicon 10, and a spacer isolation structure 50 is formed on side walls at periphery of the window, where a material of the spacer isolation structure 50 preferably selects silicon dioxide or silicon nitride.

Figure 4:
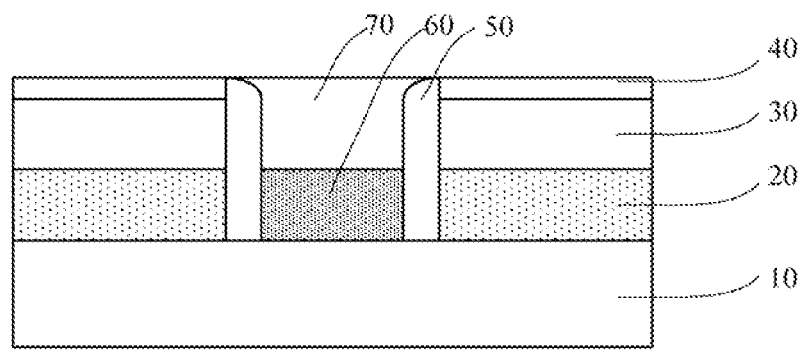

Step 3: As shown in FIG. 4, a SiGe layer 60 with the first crystal orientation is formed in the window formed with the spacer isolation structure 50, and a top silicon 70 with the first crystal orientation is continuously epitaxially grown on the SiGe layer 60, and a chemical mechanical polishing process is further performed.

Figure 5A:
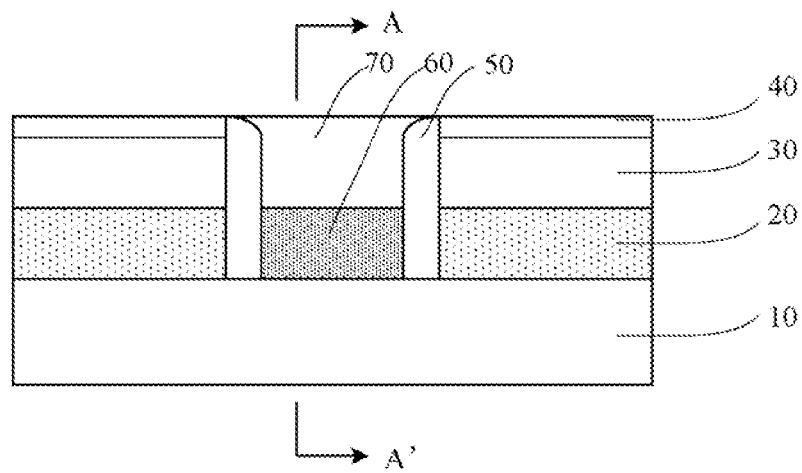
Figure 5B:
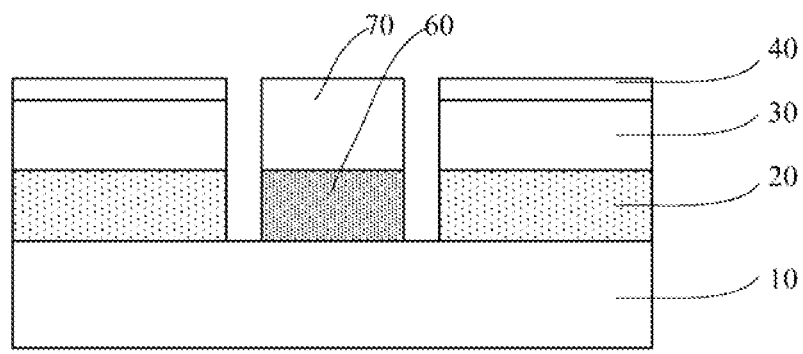
Figure 6A:
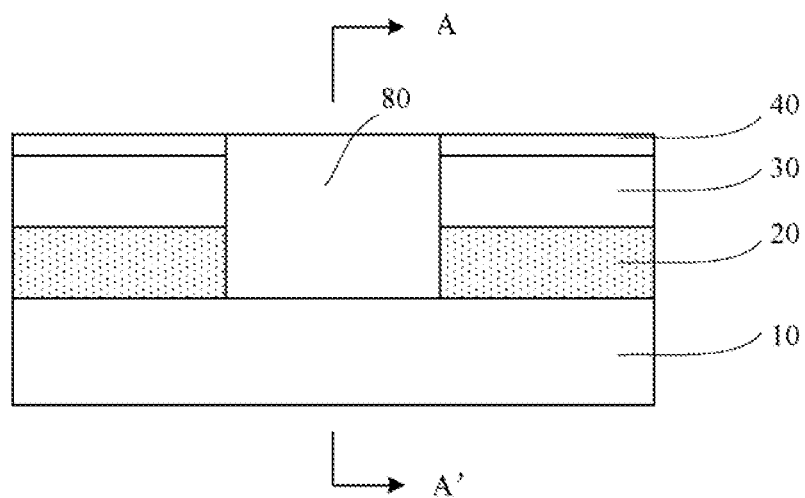
Figure 6B:
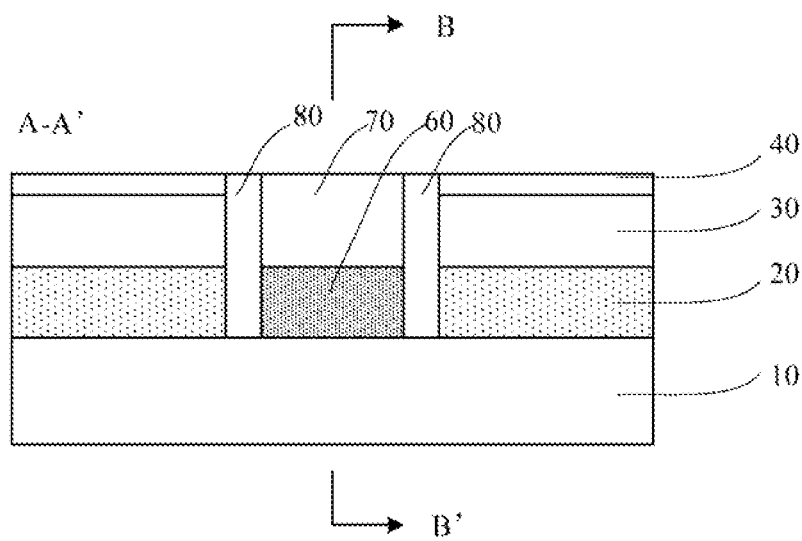
FIG. 6b is a cross-sectional view along A-A' direction in FIG. 6a, FIG. 6c is a cross-sectional view along B-B' direction in FIG. 6b.
Figure 6C:
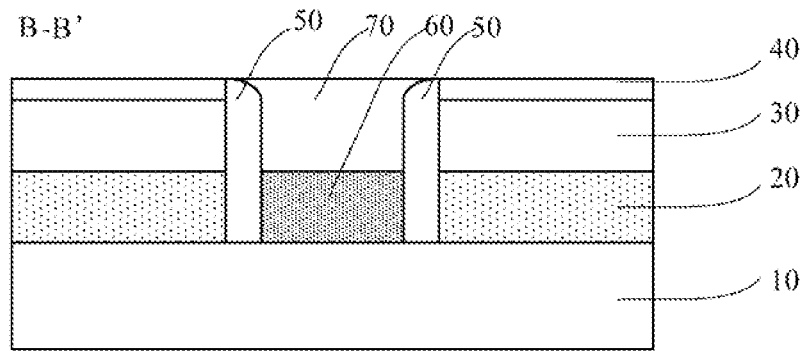

Step 4: As shown in FIG. 5a and FIG. 5b, a part of the spacer isolation structure 50 at opposite two sides of the window is etched to expose a part of the bottom silicon 10; then, as shown in FIG. 6a, FIG. 6b and FIG. 6c, a supporting material 80 is deposited at the position where the part of the spacer isolation structure 50 is etched away, so as to connect the top silicon 70 with the first crystal orientation and the top silicon 30 with the second crystal orientation. The supporting material 80 is preferably polysilicon.

Figure 7A:
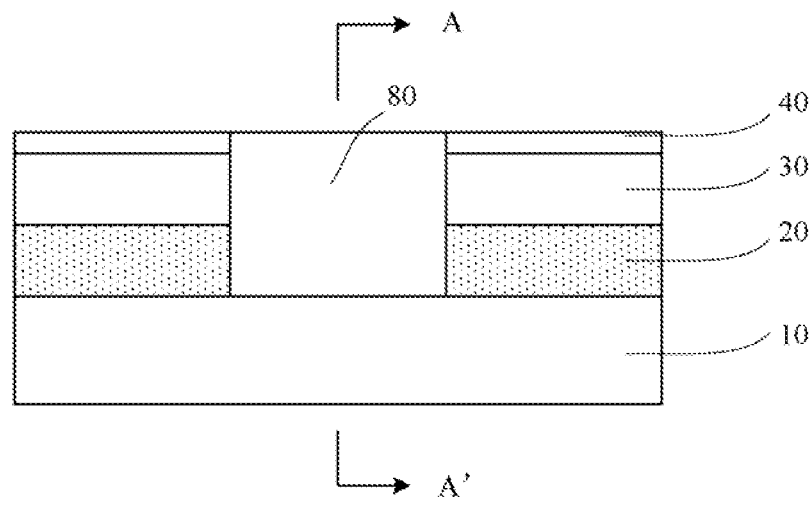
Figure 7B:
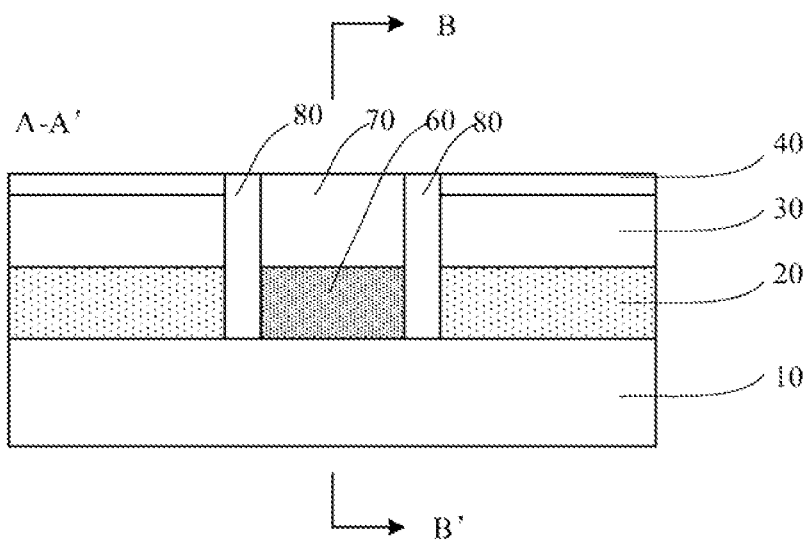
FIG. 7b is a cross-sectional view along A-A' direction in FIG. 7a, FIG. 7c is a cross-sectional view along B-B' direction in FIG. 7b.
Figure 7C:
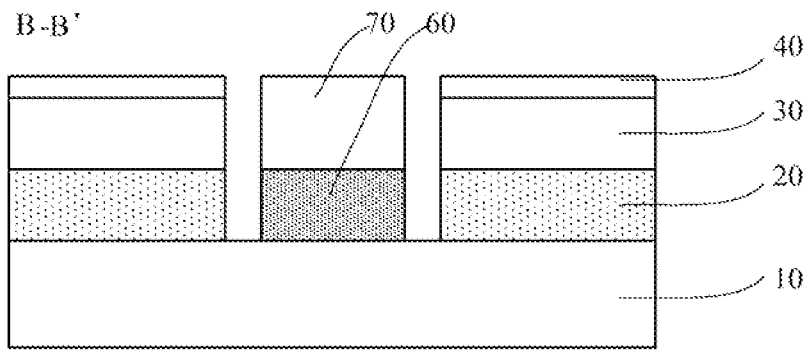
Figure 8A:
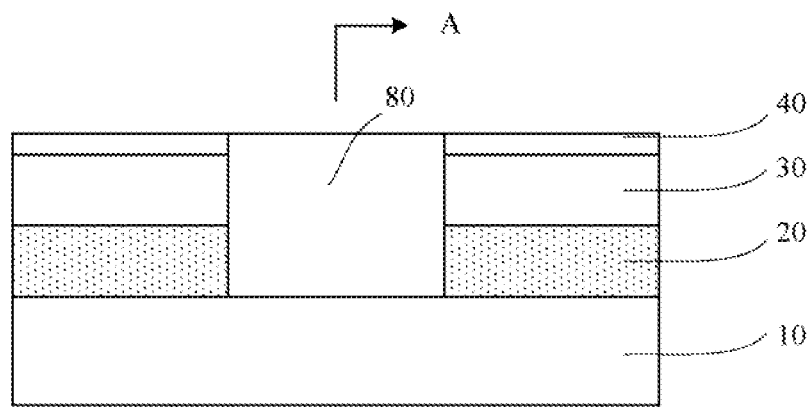
Figure 8B:
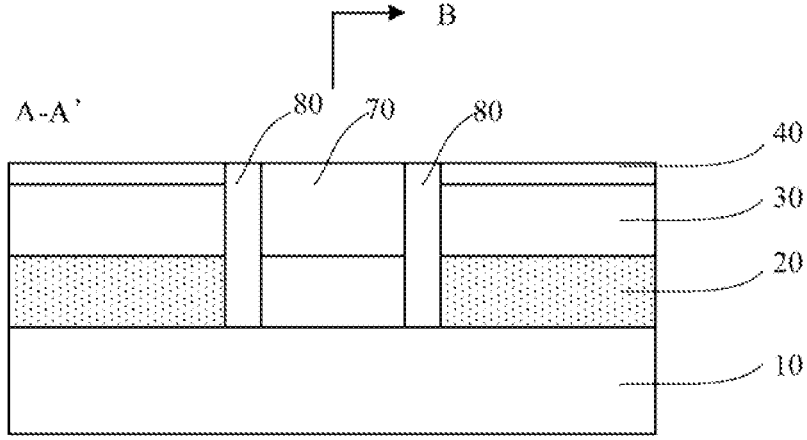
FIG. 8b is a cross-sectional view along A-A' direction in FIG. 8a, FIG. 8c is a cross-sectional view along B-B' direction in FIG. 8b.
Figure 8C:
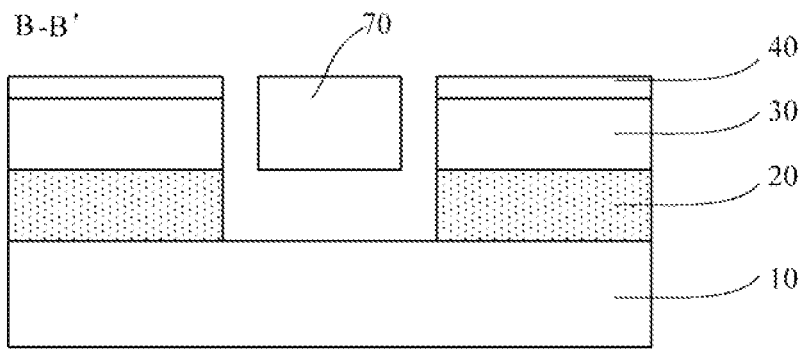

Step 5: As shown in FIG. 7a, FIG. 7b and FIG. 7c, the rest spacer isolation structure 50 is etched, and then, as shown in FIG. 8a, FIG. 8b and FIG. 8C, the SiGe layer 60 is removed by adopting a selective etching process, so that the top silicon 70 with the first crystal orientation is suspended, two sides of the top silicon 70 with the first crystal orientation is connected to the top silicon 30 through the supporting material 80 polysilicon for being supported, and the SiGe selective etching is implemented through wet etching such as $HF:H_2O_2$, $HF:H_2O_2:CH_3COOH$, and $H_2O_2:NH_4OH$, $HF:HNO_3:CH_3COOH$, or another dry etching.

Figure 9A:
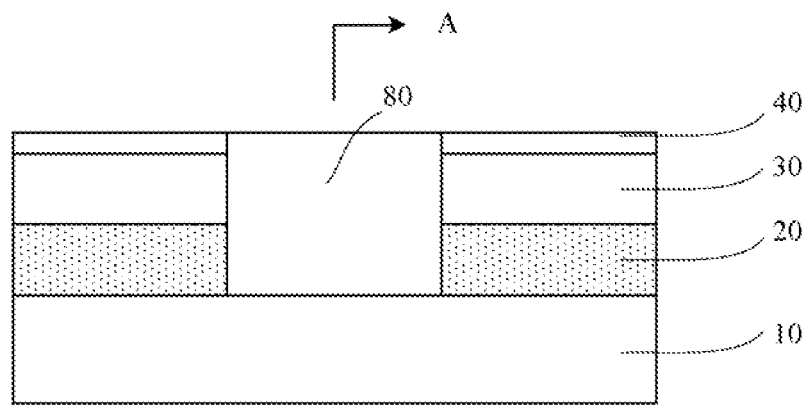
Figure 9B:
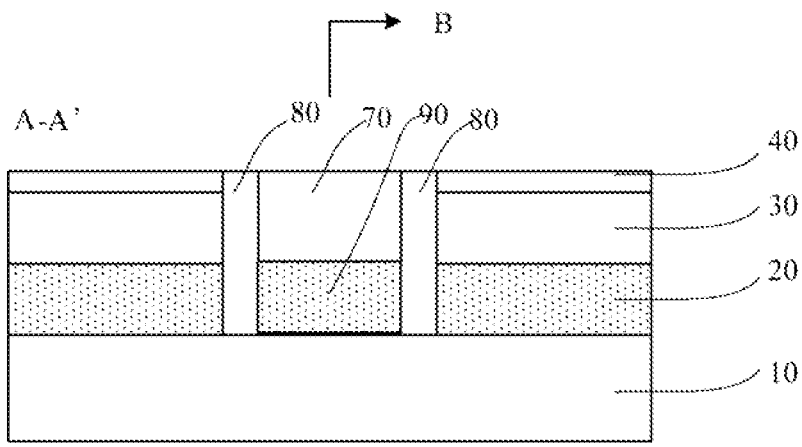
FIG. 9b is a cross-sectional view along A-A' direction in FIG. 9a, FIG. 9c is a cross-sectional view along B-B' direction in FIG. 9b.
Figure 9C:
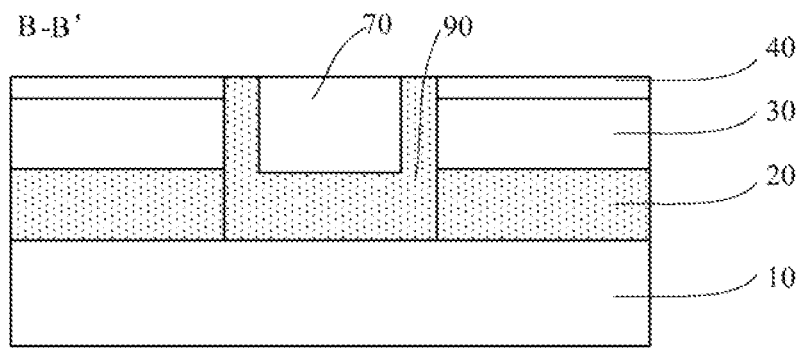

Step 6: As shown in FIG. 9a, FIG. 9b and FIG. 9c, an insulating material is filled through a method such as chemical vapor deposition (CVD), and a second insulating buried layer 90 is formed below the top silicon 70 with the first crystal orientation.

Figure 10A:
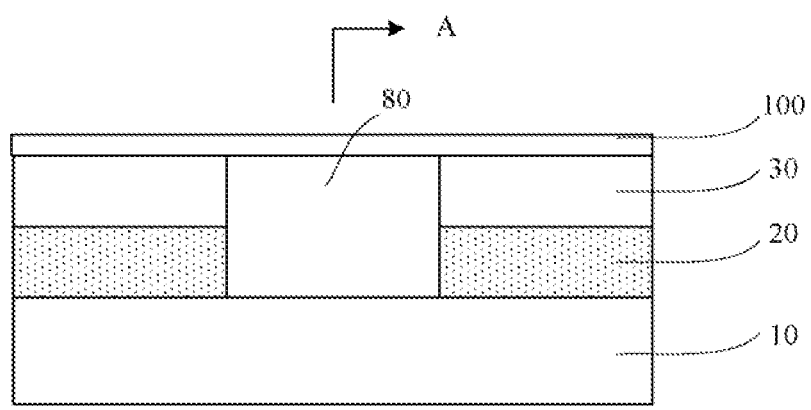
Figure 10B:
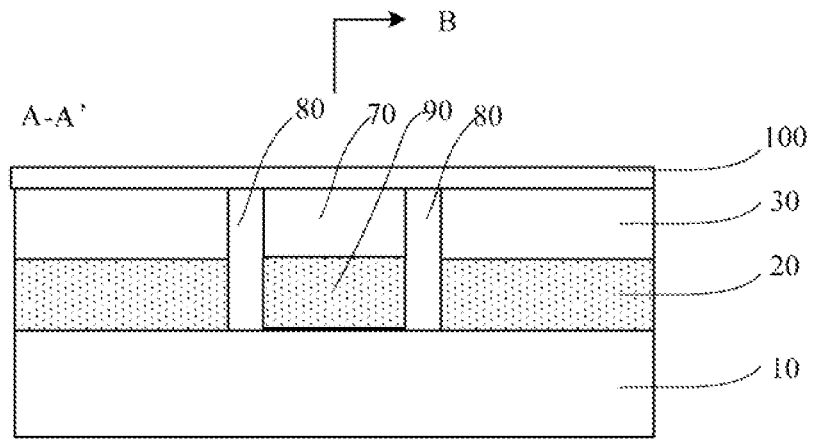
FIG. 10b is a cross-sectional view along A-A' direction in FIG. 10a, FIG. 10c is a cross-sectional view along B-B' direction in FIG. 10b.
Figure 10C:
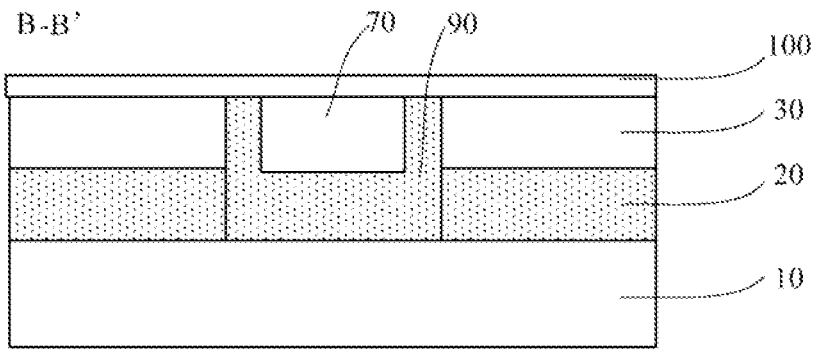
Figure 11:
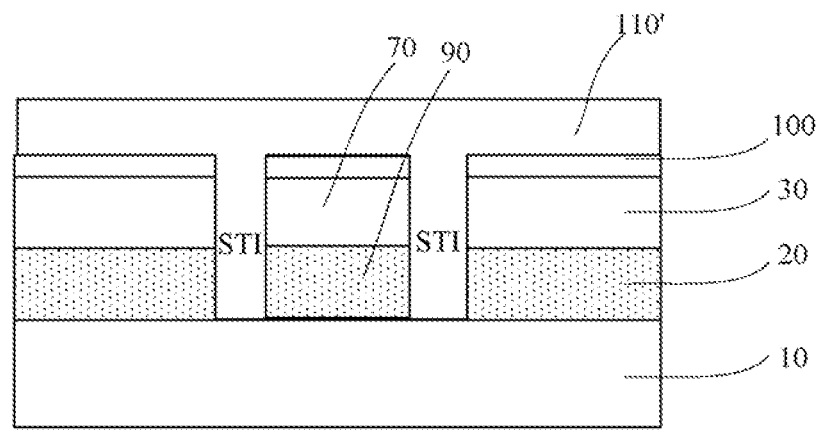
Figure 12:
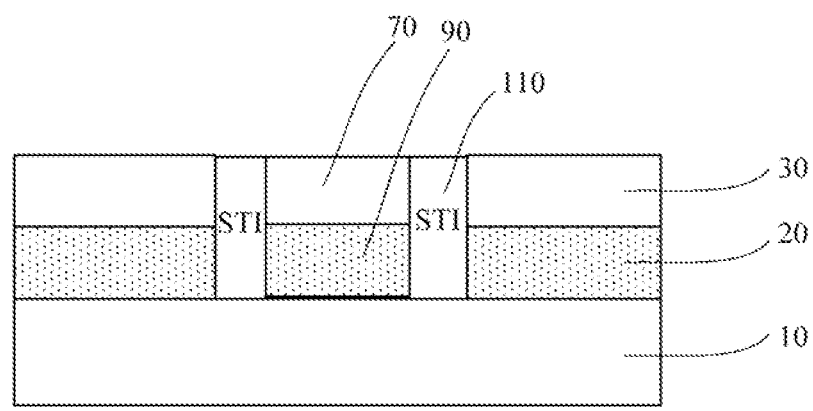

Step 7: As shown in FIG. 10a, FIG. 10b and FIG. 10c, the first hard mask 40 is removed by using hot phosphoric-acid etching, and a second hard mask 100 is fabricated to cover the surface of the SOI substrate, then, as shown in FIG. 11 and FIG. 12, the insulating material and the supporting material at the periphery of the top silicon 70 with the first crystal orientation are removed through etching, so as to form a shallow trench isolation (STI), and an insulating material 110' is deposited in the STI through high-density plasma deposition, the insulating material 110' on the second hard mask 100 is removed through chemical mechanical polishing, the second hard mask 110 is removed through hot phosphoric-acid etching, so as to form an STI structure 110 at the periphery of the top silicon 70 with the first crystal orientation, and finally a full-isolated SOI substrate with hybrid crystal orientations is obtained.

Embodiment 2

Figure 13:
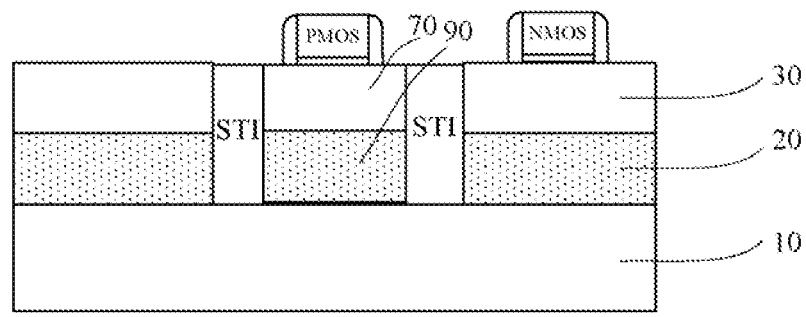
FIG. 13 is a schematic view of preparation of a CMOS IC according to Embodiment 2 of the present invention.

On the basis of the Embodiment 1, a CMOS IC based on the full-isolated SOI substrate with hybrid crystal orientations is prepared, which includes the following steps:

As shown in FIG. 13, a first type MOS device is fabricated on the top silicon 70 with the first crystal orientation of the obtained full-isolated SOI substrate with hybrid crystal orientations; a second type MOS device is fabricated on the top silicon 30 with the second crystal orientation of the obtained full-isolated SOI substrate with hybrid crystal orientations. The first crystal orientation is preferably the (110) crystal orientation, so the first type MOS device is a PMOS device; the second crystal orientation is preferably the (100) crystal orientation, so the second type MOS device is an NMOS device. When the first crystal orientation is the (100) crystal orientation, the first type MOS device should be an NMOS device, and when the second crystal orientation is the (110) crystal orientation, the second type MOS device should be a PMOS device, in this way, higher mobility can be provided for the NMOS and PMOS respectively, thereby improving the performance of the CMOS IC.

The above descriptions of the detailed embodiments are only to illustrate the preferred implementation according to the present invention, and it is not to limit the scope of the present invention. Accordingly, all modifications and variations completed by those with ordinary skill in the art should fall within the scope of the present invention defined by the appended claims.

What is claimed is:

1. A preparation method for a full-isolated silicon on insulator (SOI) substrate with hybrid crystal orientations, comprising:

step 1, providing an SOI substrate, wherein the SOI substrate comprises a bottom silicon with a first crystal orientation, an insulating buried layer located on the bottom silicon, and a top silicon with a second crystal orientation and located on the insulating buried layer;

step 2: etching the SOI substrate to form a window, wherein the window exposes a part of the bottom silicon, and forming a spacer isolation structure on side walls at periphery of the window;

step 3: epitaxially growing a SiGe layer with the first crystal orientation in the window formed with the spacer isolation structure, and continuing to epitaxially grow a top silicon with the first crystal orientation on the SiGe layer;

step 4: etching a part of the spacer isolation structure at opposite two sides of the window to expose a part of the bottom silicon, and depositing a supporting material at the position where the part of the spacer isolation structure is etched away, so as to serve as a support for connecting the top silicon with the first crystal orientation and the top silicon with the second crystal orientation;

step 5: etching the rest spacer isolation structure, and removing the SiGe layer by adopting a selective etching process, so that the top silicon with the first crystal orientation is suspended;

step 6: filling an insulating material below the top silicon with the first crystal orientation to form a second insulating buried layer; and step 7: removing the insulating material and the supporting material at the periphery of the top silicon with the first crystal orientation, fabricating a shallow trench isolation (STI) structure at the periphery of the top silicon with the first crystal orientation, and finally obtaining the full-isolated SOI substrate with hybrid crystal orientations.

2. The preparation method for a full-isolated SOI substrate with hybrid crystal orientations as in claim 1, wherein, in step 2, a first hard mask is formed on the SOI substrate, and then etching is performed to form the window.

3. The preparation method for a full-isolated SOI substrate with hybrid crystal orientations as in claim 2, wherein in step 7, the first hard mask is first removed, a second hard mask is fabricated to cover the surface of the SOI substrate, the insulating material and the supporting material at the periphery of the top silicon with the first crystal orientation are removed through etching, the STI structure is fabricated at the periphery of the top silicon with the first crystal orientation, the second hard mask is removed, and finally, the full-isolated SOI substrate with hybrid crystal orientations is obtained.

4. The preparation method for a full-isolated SOI substrate with hybrid crystal orientations as in claim 1, wherein the first crystal orientation refers to a (110) crystal orientation, and the second crystal orientation refers to a (100) crystal orientation; or the first crystal orientation refers to the (100) crystal orientation, and the second crystal orientation refers to the (110) crystal orientation.

5. The preparation method for a full-isolated SOI substrate with hybrid crystal orientations as in claim 1, wherein the supporting material is polysilicon.

6. The preparation method for a full-isolated SOI substrate with hybrid crystal orientations as in claim 1, wherein in step 6, the insulating material is filled below the top silicon with the first crystal orientation through a chemical vapor deposition (CVD) method to form the second insulating buried layer.

7. The preparation method for a full-isolated SOI substrate with hybrid crystal orientations as in claim 1, wherein the top silicon with the first crystal orientation is a strained silicon or non-strained silicon with the first crystal orientation.

8. A preparation method for a complementary metal oxide semiconductor (CMOS) integrated circuit (IC) based on a full-isolated silicon on insulator (SOI) substrate with hybrid crystal orientations, comprising:

step 1, providing an SOI substrate, wherein the SOI substrate comprises a bottom silicon with a first crystal orientation, an insulating buried layer located on the bottom silicon, and a top silicon with a second crystal orientation and located on the insulating buried layer;

step 2: etching the SOI substrate to form a window, wherein the window exposes a part of the bottom silicon, and forming a spacer isolation structure on side walls at periphery of the window;

step 3: epitaxially growing a SiGe layer with the first crystal orientation in the window formed with the spacer isolation structure, and continuing to epitaxially grow a top silicon with the first crystal orientation on the SiGe layer;

step 4: etching a part of the spacer isolation structure at opposite two sides of the window to expose a part of the bottom silicon, and depositing a supporting material at the position wherein the part of the spacer isolation structure is etched away, so as to serve as a support for connecting the top silicon with the first crystal orientation and the top silicon with the second crystal orientation;

step 5: etching the rest spacer isolation structure, and removing the SiGe layer by adopting a selective etching process, so that the top silicon with the first crystal orientation is suspended;

step 6: filling an insulating material below the top silicon with the first crystal orientation to form a second insulating buried layer;

step 7: removing the insulating material and the supporting material at the periphery of the top silicon with the first crystal orientation, fabricating a shallow trench isolation structure at the periphery of the top silicon with the first crystal orientation, and finally obtaining the full-isolated SOI substrate with hybrid crystal orientations; and step 8: fabricating a first type MOS device on the top silicon with the first crystal orientation of the obtained full-isolated SOI substrate with hybrid crystal orientations; and fabricating a second type MOS device on the top silicon with the second crystal orientation of the obtained full-isolated SOI substrate with hybrid crystal orientations.

9. The preparation method for a CMOS IC based on a full-isolated SOI substrate with hybrid crystal orientations as in claim 8, wherein the first crystal orientation is a (110) crystal orientation, so the first type MOS device is a PMOS device, and the second crystal orientation is a (100) crystal orientation, so the second type MOS device is an NMOS device.

10. The preparation method for a CMOS IC based on a full-isolated SOI substrate with hybrid crystal orientations as in claim 8, wherein the first crystal orientation is a (100) crystal orientation, so the first type MOS device is an NMOS device, and the second crystal orientation is a (110) crystal orientation, so the second type MOS device is a PMOS device.

* * * * *